(12) United States Patent
Nagahara et al.

(10) Patent No.: US 6,800,551 B2
(45) Date of Patent: Oct. 5, 2004

(54) CHEMICAL AMPLIFICATION TYPE PHOTORESIST COMPOSITION, METHOD FOR PRODUCING A SEMICONDUCTOR DEVICE USING THE COMPOSITION, AND SEMICONDUCTOR SUBSTRATE

(75) Inventors: Seiji Nagahara, Kanagawa (JP); Toyohisa Sakurada, Niigata (JP); Takao Yoshihara, Niigata (JP)

(73) Assignees: NEC Electronics Corporation, Kanagawa (JP); Shin-Etsu Chemical Co., Ltd., Tokyo (JP)

(*) Notice: Subject to any disclaimer, the term of this patent is extended or adjusted under 35 U.S.C. 154(b) by 0 days.

(21) Appl. No.: 10/308,115

(22) Filed: Dec. 3, 2002

(65) Prior Publication Data

US 2003/0157806 A1 Aug. 21, 2003

(30) Foreign Application Priority Data

Dec. 3, 2001 (JP) ........................................ 2001-369039

(51) Int. Cl.[7] ........................................... H01L 21/4763
(52) U.S. Cl. ..................... 438/638; 438/620; 438/622; 438/637; 438/639; 438/780; 438/949
(58) Field of Search ............................... 430/270.1, 311, 430/322; 438/614, 620, 622, 629, 637–640, 780, 781, 948, 949

(56) References Cited

U.S. PATENT DOCUMENTS

2002/0068442 A1 * 6/2002 Shimpuku .................. 438/638
2004/0002007 A1 * 1/2004 Hitoshi et al. ................. 430/1

FOREIGN PATENT DOCUMENTS

| JP | 6-331541 | 12/1994 |
|---|---|---|
| JP | 11-84639 | 3/1999 |
| JP | 2000-89488 | 3/2000 |
| JP | 2001-92122 | 4/2001 |
| JP | 2001-139696 | 5/2001 |
| JP | 2001-194776 | 7/2001 |
| JP | 2001-217242 | 8/2001 |
| JP | 2001-226696 | 8/2001 |
| WO | WO 00/01752 | 1/2000 |

* cited by examiner

Primary Examiner—David A. Zarneke
Assistant Examiner—Asok Kumar Sarkar
(74) Attorney, Agent, or Firm—Young & Thompson

(57) ABSTRACT

To provide a chemical amplification type positive photoresist composition suited to resist patterning of a substrate presenting surface step differences, a method for manufacturing the semiconductor device employing this composition, and a semiconductor substrate. In a method for manufacturing a semiconductor device, a resist film is formed using a chemical amplification type positive photoresist composition, comprised of a base resin and a basic compound added to the base resin at a rate of 1 to 100 mmol to 100 g of the base resin, on a substrate halving surface step differences and into which the organic removing solution is deposited or oozed, and a predetermined area of the resist film is exposed to light to form a resist pattern.

16 Claims, 9 Drawing Sheets

FIG. 2
CAPILLARY ELECTROPHORESIS (ELECTROPHEROGRAM)
<IDENTIFICATION OF ORGANIC EXFOLIATION SOLUTION>
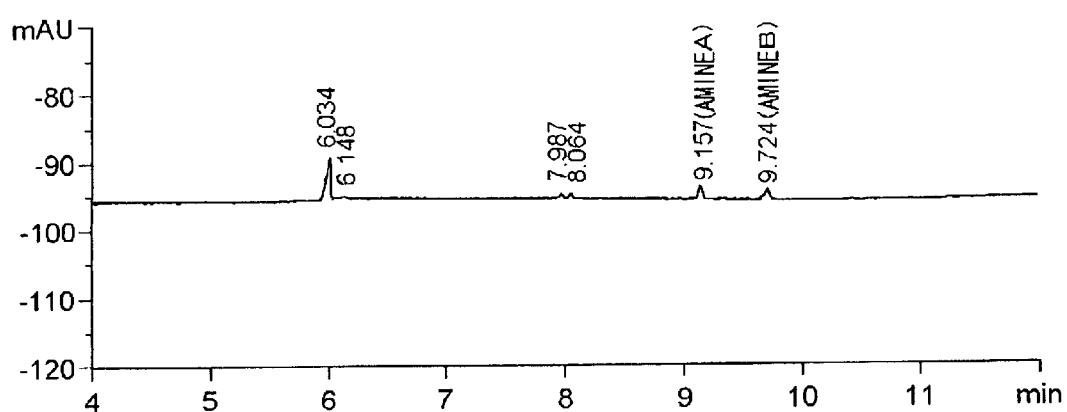
<IDENTIFICATION OF COMPONENTS AFFIXED TO SUBSTRATE>
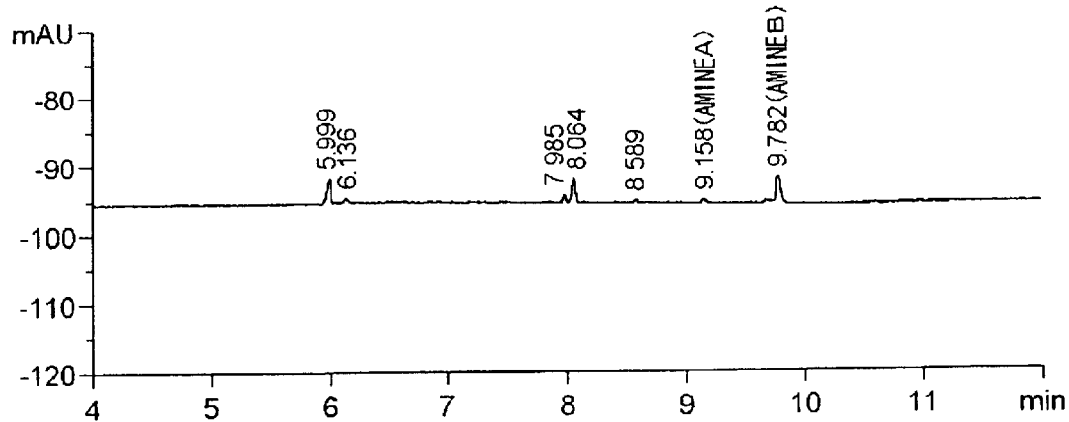

FIG. 3
|  | COMPARATIVE EXAMPLE | EXAMPLE 1 |
|---|---|---|
| PATTERN 1 |  |  |
| PATTERN 2 | 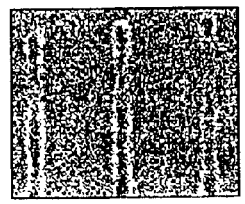 | 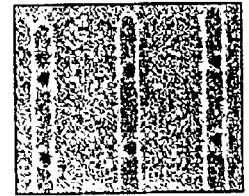 |
| PATTERN 3 | 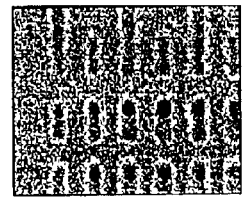 | 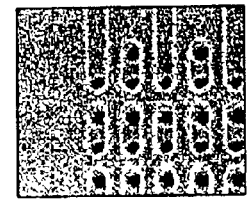 |
| PATTERN 4 | 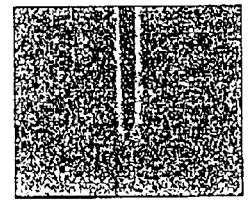 | 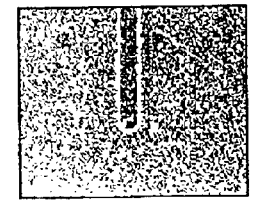 |
| PATTERN 5 | 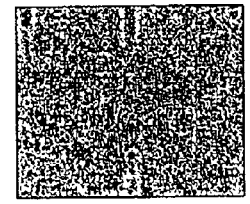 |  |

[SUBSTRATE 1(SILICON OXIDE FILM)]

FIG. 7

[SUBSTRATE 2 (Low−k FILM ; HSQ)]

|  | PATTERN 1 | PATTERN 2 |
|---|---|---|
| SAMPLE 1 (COMPARATIVE EXAMPLE) | | |
| SAMPLE 2 (COMPARATIVE EXAMPLE) | | |
| SAMPLE 3 (COMPARATIVE EXAMPLE) | | |
| SAMPLE 4 (COMPARATIVE EXAMPLE) | | |
| SAMPLE 5 (COMPARATIVE EXAMPLE) | | |
| SAMPLE 6 (COMPARATIVE EXAMPLE) | | |

CHEMICAL AMPLIFICATION TYPE PHOTORESIST COMPOSITION, METHOD FOR PRODUCING A SEMICONDUCTOR DEVICE USING THE COMPOSITION, AND SEMICONDUCTOR SUBSTRATE

FIELD OF THE INVENTION

This invention relates to a chemical amplification (or chemically amplified) type [Kagakuzofuku-gata] photoresist composition, a method for producing a semiconductor device using the composition, and a semiconductor substrate. More particularly, it relates to a chemical amplification type photoresist composition for prohibiting resist pattern resolution defects, a method for producing a semiconductor device using the composition, and a semiconductor substrate.

Definition: The term "chemical amplification (or chemically amplified) type photoresist" used herein denotes a class of the photoresist that falls within the following category:

Chemical amplification type photoresist composition means a composition containing an acid generating agent as a sensitizer in the resist, generating acid therefrom upon light exposure, thus inducing the catalytic reaction by the generated acid during the subsequent heat treatment, thereby accelerating soluble or insoluble property against the developing solution.

BACKGROUND OF THE INVENTION

As a method for forming multi-layered wirings for a semiconductor integrated circuit, buried wirings (Damascene techniques) is effective. In these techniques, the dual Damascene technique, consisting in forming a wiring trench for forming an upper layer wiring and a via hole or a contact hole interconnecting the upper layer wiring and a lower layer wiring or substrate in an insulating film, and in burying the same metal film in both the wiring trench and the via hole to form the interconnections and the via as one, gives rise to an advantage that production costs may be lowered appreciably through simplifying and expediting the production process.

On the other hand, a low dielectric constant film (Low-k film) has been brought into use as an inter-layer insulating film intermediate the wirings in the multilayer wiring structure, in order to diminish the capacitance across neighboring wirings to reduce signal delay through the wirings.

An instance of a conventional via first dual Damascene interconnection forming method is now explained.

First, a first etching barrier film 7, a first inter-layer insulating film 6, a second etching barrier film 5, a second inter-layer insulating film (low dielectric constant film) 4, and a cap film (insulating film) 3, are formed on an underlying Cu wiring layer 8, in this order, looking from the substrate side. An anti-reflection film then is coated on the entire substrate surface, and a first photoresist pattern for forming via-holes is deposited on the surface of the anti-reflection film. Using this first photoresist pattern as an etching mask, the anti-reflection film, cap film 3, second inter-layer insulating film 4, second etching barrier film 5 and the first inter-layer insulating film 6 are selectively continuously etched, until the first etching barrier film 7 is exposed. This forms a via-hole 21 (see FIG. 9a).

The anti-reflection film and the first photoresist pattern are then removed by ashing or an organic removing (peeling) liquid (see FIG. 9a). An anti-reflection film 2 then is formed on the entire substrate surface such that the via-hole 21 is not completely buried (see FIG. 9b). A photoresist 1 then is coated on the surface of the anti-reflection film 2 (see FIG. 9c). The coated photoresist is exposed to light to form a second photoresist pattern 1 for forming a wiring trench (see FIG. 9d). Using this second photoresist pattern as an etching mask, the anti-reflection film 2, cap film 3 and the second inter-layer insulating film 4 are selectively continuously etched until the second etching barrier film 5 is exposed (see FIGS. 9e and f). This forms a wiring trench 22.

The anti-reflection film 2 and the second photoresist pattern 1 are then peeled or removed by ashing or with an organic removing solution. The exposed first etching barrier film 7 then is etched by an etchback method until the underlying Cu wiring layer 8 is exposed (see FIG. 9g). The substrate, the underlying Cu wiring layer 8 of which has now been exposed, is rinsed. After forming a seed film and a metal barrier film on the substrate, a Cu plating film 9 is deposited until it is buried in the via-hole and in the wiring trench. The Cu plating film 9 and the cap film 3 are planarized by CMP (chemical mechanical polishing) until the cap film 3 is substantially ground off by polishing (see FIG. 9h). This forms a dual Damascene wiring 9 electrically connected to the lower Cu wiring layer 8 (See JP-P2001-217242A).

SUMMARY OF THE DISCLOSURE

According to an experiment, conducted by the present inventors, if, with use of a conventional chemical amplification type photoresist composition (positive type) as the photoresist, the second photoresist pattern 1 is formed, the photoresist in the via-hole 21 and in the neighboring area is not decomposed, even on light exposure, such that the photoresist is left over even on processing with the developing solution (see FIG. 9d. The state of the substrate surface is shown in FIG. 3 as Comparative Example. Referring to respective patterns in the Comparative Example, the portions of the substrate, corresponding to the via-holes, are inherently represented in black as a shadow of the groove. In the present Comparative Example, there are those via-holes in which the black shadows by the groove are not represented such that the via-holes are charged with the photoresist buried therein.

According to the technical information, acquired by the present inventors, the reason this problem arises is that, if the anti-reflection film and the chemical amplification type photoresist composition are coated and exposed to light without pre-treatment (such as heating, UV processing or oxygen plasma processing), the pollutants, such as basic compounds or moisture, affixed to or soaked into the substrate surface (such as via-hole wall surface of the inter-layer insulating film), tend to be transmitted through the anti-reflection film at the time of baking the anti-reflection film and the photoresist (pre-baking for solvent removal) so as to be intruded into the photoresist.

That is, in the via first dual Damascene method, an organic alkaline removing solution is used to remove the resist pattern used for forming the via-hole. The pollutants contained in this organic removing solution, such as basic compounds (amino components), moisture in air or floating basic compounds, are affixed to or seep into the via-hole wall surface (inter-layer insulating film) where the pollutants are concentrated. If the anti-reflection film for the wiring groove and the photoresist (chemical amplification type positive photoresist composition) are then coated on the substrate surface, inclusive of the via-hole wall surface, and pre-baked, the pollutants concentrated on the via-hole wall surface are transmitted from the via-hole wall surface through the anti-reflection film so as to be intruded into the photoresist. The so intruded pollutants, such as amino compounds, are neutralized with catalytic acids ($H^+$) yielded on light exposure due to photodecomposition of the acid generating agents contained in the photoresist (chemical amplification type positive photoresist composition). Should this neutralization reaction between the pollutants and the acid catalyst occur, the acid catalyst in the photoresist is deactivated and hence falls into shortage. This phenomenon is known as poisoning. The photoresist lying in an area where the acid catalyst is deactivated cannot be turned, even on light exposure, into a substance soluble in a developing solution (change in polarity). For example, protective groups, such as acetyl groups, cease to exhibit protective action such that the chain reaction into hydroxyl groups is scarcely produced. The area of the substrate which has not been turned into the developing solution, such as the inside of the via-hole or its vicinity, is left over without being dissolved in the developing solution. As a consequence, resolution defects of the resist pattern occur in the inside of the via-hole or its vicinity.

An experiment conducted by the present inventors revealed that, although a satisfactory resist pattern could be resolved with the conventional chemical amplification type photoresist, in the absence of the via-hole, in case development was carried out for 30 minutes under the condition in which the poisoning occurs, the poisoning occurs severely around the via-hole, such that the resist pattern suffers from resolution deficiency. Although the resistance against the poisoning can be improved by extending the development time duration to 60 seconds, the resolution was still insufficient.

Another experiment conducted by the present inventors also indicated that this problem (resolution defect) was more apparent when a low dielectric constant insulating film (Low-k film with the specific dielectric constant k<4.0) was used as the inter-layer insulating film in place of the conventional silicon oxide film. That is, such a problem has presented itself that, if the low dielectric constant insulating film is used, the area where the photoresist is left without becoming dissolved in the developing solution, that is the photoresist not resolved even on light exposure, is increased.

The inventor's technical knowledge indicates that this problem is ascribable to the fact that, since the low dielectric constant film (low-k film) is a porous film presenting interstices in its molecular structure, in a majority of cases, this interstice (fine pores) in the molecular structure increasing with the tendency towards the low dielectric constant. Thus, more pollutants are liable to be affixed (adsorbed) or seep into the film than in case of a routine inter-layer insulating film ($SiO_2$). The result is that the quantity of the pollutants intruded from the low dielectric constant film into the photoresist is larger than in case of the silicon oxide film to increase the area subjected to resolution defects of the resist pattern.

The photoresist, thus left, overlies the rim of the via-hole on the surface of the cap film 3, such that, when the wiring groove 22 is to be etched, the residual photoresist operates as a visor on the cap film 3, with the result that a protrusion 10 in the form of a tapered cylinder comprised of the cap film 3 and the second inter-layer insulating film 4 is formed around the outer rim of the via-hole (see FIG. 9g). If the low dielectric constant film (Low-k film) is used as the inter-layer insulating film, the protrusion 10 is increased in size. If the Cu dual Damascene wiring 9 is formed as the protrusion 10 is left over, separation or connection defects occur intermediate the wiring and the via-hole in the dual Damascene wiring 9, due to the protrusion 10, with the result that the electrical connection between the wiring and the via-hole in the dual Damascene wiring 9 is insufficient (see FIG. 9h). The result is the lowered reliability of the semiconductor device.

It is a primary object of the present invention to provide a method for producing a semiconductor device suited to resist patterning of a substrate presenting surface step differences.

It is a second object of the present invention to provide a method for producing a semiconductor device suited to resist patterning of a substrate having low dielectric constant.

It is a third object of the present invention to provide a method for producing a semiconductor device which lends itself to simplification and speedup of the manufacturing process.

It is a fourth object of the present invention to provide a semiconductor substrate having an optimum resist pattern formed thereon.

It is a fifth object of the present invention to provide a chemical amplification type positive photoresist composition which may be suitably used for the method for producing the semiconductor device.

In a first aspect, the present invention provides a method for producing a semiconductor device including the steps of forming a resist film on a substrate, using a chemical amplification type photoresist composition comprised of a base resin and a basic compound added to the base resin in a range of not less than 1 mmol to not more than 100 mmol to 100 g of the base resin, and exposing a predetermined area of the resist film to light to form a resist pattern.

In a second aspect, the present invention provides a method for producing a semiconductor device including the steps of forming a resist film on a substrate, having a hole or a trench formed in a surface thereof, using a chemical amplification type photoresist composition comprised of a base resin and a basic compound added to the base resin in a range of not less than 1 mmol to not more than 100 mmol to 100 g of the base resin, and exposing a predetermined area of the resist film to light to form a resist pattern.

In a third aspect, the present invention provides a method for producing a semiconductor device including the steps of removing from a substrate, etched using a first resist pattern, the first resist pattern, using at least an organic removing solution, and forming a resist film on the substrate, from which the first resist pattern has been removed, using a chemical amplification type photoresist composition comprised of a base resin and a basic compound added to the base resin in a range of not less than 1 mmol to not more than 100 mmol to 100 g of the base resin, and exposing a predetermined area of the resist film to light to form a second resist pattern.

In a fourth aspect, the present invention provides a method for producing a semiconductor device including the steps of: removing from a substrate, having a via-hole formed therein using a first resist pattern, the first resist pattern, using at least an organic removing solution, and forming a resist film on a substrate, having a via-hole formed therein, using a chemical amplification type photoresist composition comprised of a base resin and a basic compound added to the base resin in a range of not less than 1 mmol to not more than 100 mmol to 100 g of the base resin, and exposing a predetermined area of the resist film to light to form a second resist pattern used for forming a wiring groove.

In a fifth aspect, the present invention provides a chemical amplification type photoresist composition comprising a base resin and a basic compound added to the base resin in a range of not less than 1 mmol to not larger than 100 mmol to 100 g of the base resin.

Preferably, the substrate is (1) such a substrate in which one or more porous films are exposed on a surface or a sidewall surface, (2) such a substrate in which one or more porous films are exposed on a surface or a sidewall surface, or (3) such a substrate in which one or more low dielectric films with a specific dielectric constant less than 4 are exposed on a surface or a sidewall surface Preferably, the chemical amplification type photoresist composition is such a chemical amplification type photoresist composition which is comprised of a base resin and a basic compound added to the base resin in a range of not less than 2 mmol to not more than 50 mmol to 100 g of the base resin.

Preferably, the chemical amplification type photoresist composition which is comprised of a base resin and an acid generating agent added to the base resin in a range of not less than 0.2 weight parts to not more than 20 weight parts and in particular 0.5 weight parts and not larger than 10 weight parts of the base resin.

Preferably, the resist pattern or the second resist pattern in the method for producing a semiconductor device includes an opening in an area of the substrate including a sidewall surface in a step difference portion thereof.

Preferably, a predetermined area of the resist film in the method for producing a semiconductor device is exposed to light and subsequently developed for not less than 30 seconds and in particular for not less than 60 seconds using a developing solution.

In a sixth aspect, the present invention also provides a semiconductor substrate including a resist pattern formed by the method for producing the semiconductor device.

BRIEF DESCRIPTION OF THE DRWINGS

FIGS. 1a–1h are partial cross-sectional views illustrating, step-by-step, a method for manufacturing a semiconductor device according to Example 1 of the present invention.

FIG. 2, includes two graphs illustrating the results of identifying the components affixed to a substrate having a Low-k film following the step A6 of Example 1, by the capillary electrophoretic method.

FIG. 3 is an enlarged photo showing, for comparison, the states of the substrate surface following the process of forming a resist pattern for forming the wiring groove in the manufacturing methods for the semiconductor device of the Example 1 and the Comparative Example.

FIG. 7 is an enlarged photo showing the states of the substrates following the process of forming the resist pattern for forming the wiring groove in the method for manufacturing the semiconductor device of Example 1 and the Comparative Example 1 (substrate 2, samples 1 to 6).

PREFERRED EMBODIMENTS OF THE INVENTION

Figure 1A:
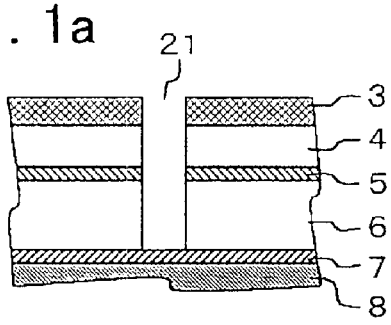
Figure 1B:
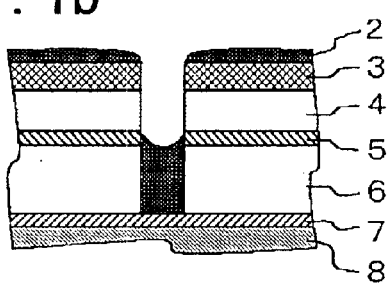
Figure 1C:
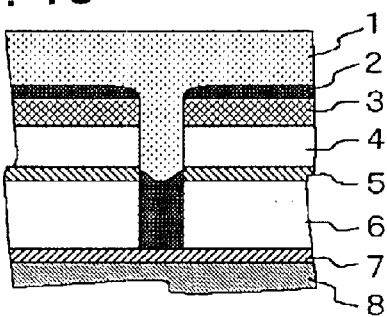
Figure 1D:
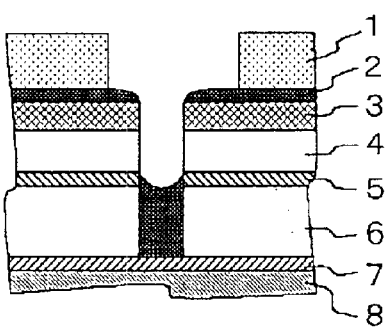
Figure 1E:
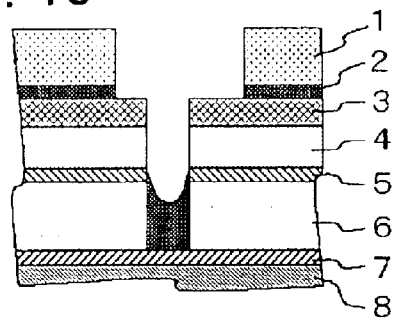
Figure 1F:
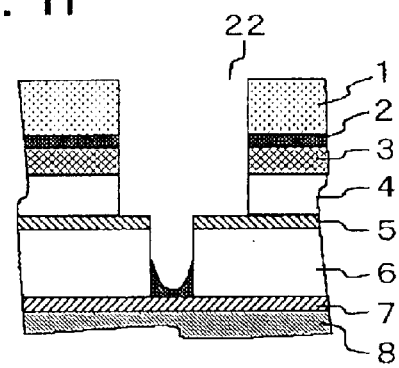
Figure 1G:
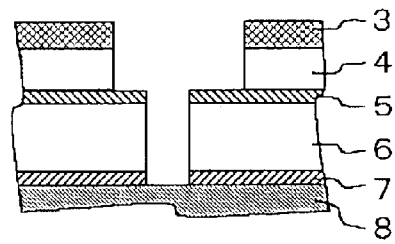
Figure 1H:
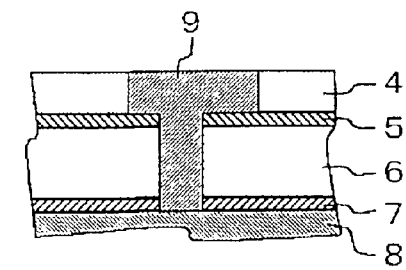

In the method for producing the semiconductor device, a resist film (1 of FIG. 1a) is formed on a substrate (semiconductor substrate) having a surface step difference (21 of FIG. 1a), using a chemical amplification type photoresist composition comprised of a base resin and a basic compound added to the base resin in a range of not less than 1 mmol to not more than 100 mmol to 100 g of the base resin, to form a resist film (1 of FIG. 1c), and a predetermined area of the resist film is exposed to light to form a resist pattern (1 of FIG. 1d). Even if the photoresist is poisoned by the poisoning component in the organic removing solution deposited to the vicinity of the step difference portion, it is possible to prevent the concentration of the acid catalyst from being lowered drastically, thanks to the buffering action of the basic compound in the resist. Thus, the light exposed portion of the resist can be converted into a substance soluble in the developing solution if the photoresist is of the positive type, or into a substance sparingly soluble in the developing solution if the photoresist is of the negative type, and hence a satisfactory resist pattern may be produced.

Referring to the drawings, an Example 1 of the present invention is now explained. FIG. 1 is a schematic partial cross-sectional view of a substrate for illustrating, step-by-step, the method for producing the semiconductor device of the Example 1 of the present invention.

On the surface of a substrate, carrying a Cu underlying wiring 8 exposed on the surface, an etching barrier film 7 (SiCN; film thickness, 70 nm), an inter-layer insulating film 6 ($SiO_2$; film thickness, 350 to 400 nm), an etching barrier film 5 (SiC; film thickness, 50 nm), an inter-layer insulating film 4 (silicon oxide film or low-k film; film thickness, 300 nm) and a cap film 3 ($SiO_2$; film thickness, 250 nm) are formed in this order, beginning from the substrate side, by a CVD (chemical vapor deposition method) or a coating method.(step A1, see FIG. 1a).

The cap film 3 may also be formed as a CMP stopper film of, for example, SiN, SiC, SiON or SiCN, in place of $SiO_2$.

In the present Example, a silicon oxide film or a low-k film (HSQ film (hydrogen silsesquioxane); $SiO_2$ film containing Si–H, which may be prepared by a coating method; specific dielectric constant <3.0) is used as the inter-layer insulating film 4. In addition, low-k films, for example, inorganic insulating films, such as SiOF, SiOB, BN, SiOC or porous silica films, methyl group containing $SiO_2$, polyimide based films, valerin based films, polytetrafluoroethylene based films, copolymer films, or organic insulating films, such as fluorine-doped amorphous carbon films, may also be used.

The etching barrier film 5 may also be SiN, SiON or SiCN, in addition to SiC.

Similarly to the inter-layer insulating film 4, the inter-layer insulating film 6 may be a Low-k film, instead of $SiO_2$.

As the etching barrier film 7, SiC, SiN or SiON may be used, instead of SiCN. Meanwhile, if the etching selection ratio is to be used, the etching barrier film 7 is to be formed of a material different from the material of the etching barrier film 5.

The surface of the cap film 3 then is coated with a composition which is to form the anti-reflection film (spin-coating). The resulting product is pre-baked at 200° C. for 90 seconds to form an anti-reflection film adjusted to a film thickness of 50 nm (step A2). The surface of the anti-reflection film, thus formed, is then coated with a photoresist composition (chemical amplification type positive photoresist composition), by spin coating, and the resulting product is pre-baked at 95° C. for 90 seconds, using a hot plate, to form the photoresist film (step A3). The substrate, now carrying the photoresist film (chemical amplification type positive photoresist), is then exposed to light, using a KrF excimer laser scanner (manufactured by Nikon under the trade item of NSR-S204B), with an optimum exposure light volume and optimum focus. The resulting product is post-baked at 105° C. for 90 seconds, immediately after light exposure, and the resulting product is developed for 60 seconds in an aqueous solution of tetramethyl ammonium hydroxide, containing 2.38 wt % of the developing solution (step A4). This yields a resist pattern for forming a via-hole.

As the composition for forming the anti-reflection film, a composition for forming the anti-reflection film, containing a polymer material, light absorbing agent (light-absorbing site), acid catalysts, organic solvents and water, manufactured by TOKYO OKA KOGYO SHA (see JP Patent Kokai Publication No. JP-P2001-92122A), or a composition for forming the anti-reflection film, manufactured by Clarient Inc. (International Publication WO 00/01752) is used in the present Example. The disclosures of JP-P2001-92122A and WO 00/01752 are incorporated herein by reference thereto.

The photoresist composition in the present Example is a chemical amplification type positive photoresist film composition containing base resins, acid generating agents, basic compounds and solvents.

The base resin in the present Example is polyhydroxystyrene, partially protected by an acid unstable group (protective group: acetyl group) (see chemical formula 1 below). The base resin is a resin, insoluble or sparingly soluble in alkali, containing an acidic functional group protected by an acid unstable group. Specifically, the base resin is such a resin which becomes alkali-soluble on desorption of the acid unstable groups. The weight-average molecular weight (Mw) of this base resin is 10,500. The proportion of substitution (protection ratio) of the base resin with the acid unstable groups is 30 mol % (content of phenolic hydroxyl groups being 70 mol %). The multi-dispersion ratio of this base resin (Mw/Mn) is 1.1 (Mn being the number average molecular weight of the base resin). The base resin may not be polyhydroxystyrene but also be polyhydroxystyrene, phenolic hydroxyl groups of which have been partially protected by the acid unstable groups. In this case, the weight average molecular weight of this base resin is preferably 5,000 to 100,000. If the weight average molecular weight is less than 5,000, the resin may be inferior in film-forming properties and in resolution, whereas, if the weight average molecular weight exceeds 100,000, the resin may be inferior in resolution. The acid unstable groups (protective groups) in the base resin may, in addition to being the acetyl groups, be one or more of the groups depicted by the general formula (1) of the chemical formula 2, the groups depicted by the general formula (2) of the chemical formula 2, tertiary alkyl groups with 4 to 20 carbon atoms, trialkyl silylgroups, the respective alkyl groups of which contain 1 to 6 carbon atoms, and oxyalkyl groups with 4 to 20 alkyl groups. The proportion of substitution by the acid unstable groups in the base resin is 0 to 80 mol % and in particular 12 to 70 mol %. As for the base resin, reference may be had to paragraphs [0046] to [0075] of the JP Patent Kokai Publication No. JP-A-11-84639 and to paragraphs [0011] to [0017] of JP Patent Kokai Publication No. JP-P2001-194776A. The base resin may also be a so-called ESCAP based polymer comprised of a copolymer comprised of hydroxystyrenes and methacrylates (see JP-Patent Kokai Publication No. JP-P2001-139696A). In this case, however, resolution defects tend to be produced as compared to the case of using acetyl protective groups. It should be noted however that, for realizing e.g., the rectangular shape of the acetyl-based polymer, a minor quantity of the ESCAP based polymer may effectively be blended in such a quantity as not to deteriorate resist resolution characteristics. As for the base resin (polymer material), not only the polymer material used for KrF excimer laser lithography but also the polymer material suited as light source used in lithography, such ArF excimer laser lithography, $F_2$ excimer laser lithography or electron ray lithography, may be used for comparable results. The disclosures of JP-A-11-84639, JP-P2001-194776A and JP-P2001-139696A are incorporated herein by reference thereto.

[Chemical Formula 1]

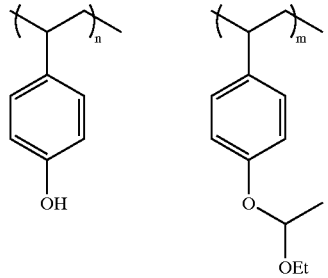

[Chemical Formula 2]

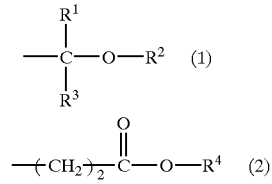

As the acid generating agent, PAG1 to 5 (see Chemical formula 3 below) are used in the present Example in a quantity (total quantity) of 1 to 9.6 weight parts to 100 weight parts of the base resin. Examples of the acid generating agents include, in addition to PAG1 to 5, onium salts, diazomethane derivatives, glyoxim derivatives, β-ketosulfone derivatives, disulfone derivatives, nitrobenzene sulfonate derivatives, sulfonate derivatives, and imide-yl sulfonate derivatives. The quantity of acid generating agents used is 0.2 to 20 weight parts and in particular 0.5 to 10 weight parts to 100 weight parts of the base resin. If the quantity is less than 0.2 weight part, the amount of the acid generated on light exposure is small, with the resolution also being inferior, whereas, if the quantity exceeds 20 weight parts, the resist may be inferior in transmittance and in resolution. As for details of the acid generating agents, reference may be had to paragraphs [0076] to [0084] of the JP Patent Kokai Publication No. JP-A-11-84639 and to paragraphs [0018] to [0028] of JP Patent Kokai Publication No. JP-P2001-194776A. The disclosures of JP-A-11-84639 and JP-P2001-194776A are incorporated herein by reference thereto.

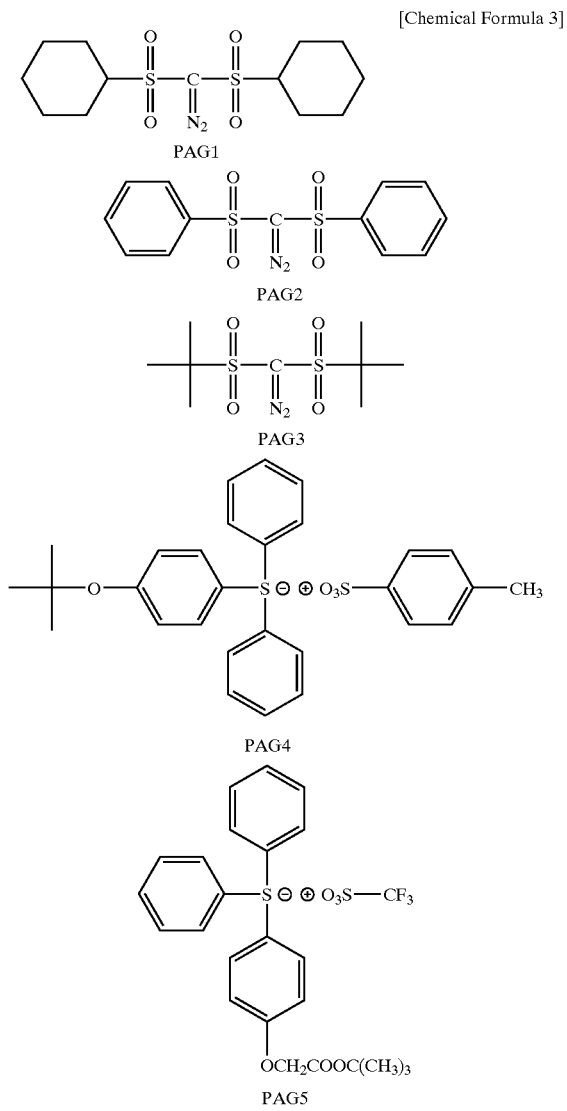

In the present Example, one or two of triethaolamine, tri-n-butylamine and 2-butoxypyridine is used as a basic comound (quencher), with the quantity of addition being 1 to 4.2 mol % of the basic compound to 100 g of the base resin. In the following explanation, the unit of mmol/poly-100 g is used. It should be noted that the basic compounds (quenchers) may also be routinely used primary, secondary and tertiary aliphatic amines, mixed amines, aromatic amines, hetero cyclic amines, nitrogen compounds containing carboxylic groups, nitrogen compounds containing sulfonyl groups, nitrogen compounds containing hydroxyl groups, nitrogen compounds containing hydroxyphenyl groups, alcoholic nitrogen compounds, amide derivatives and imide derivatives. The quantity of the basic compounds (quenchers) used may be 1 to 100 mmol/poly-100 g and preferably 2 to 50 mmol/poly-100 g. If the quantity used is less than 2 mmol/poly-100 g, it may become impossible to keep the quantity of the acid at a preset level at the time of light exposure, thus possibly deteriorating the resolution. On the other hand, if the quantity used exceeds 100 mmol/poly-100 g, it becomes difficult to adjust the sensitivity even if the quantity of addition of the acid generating agent is increased, the development time is elongated or the ratio of protection of the base resin is raised. As for the preferred condition, if the quantity is less than 2 mmol/poly-100 g, it may be an occurrence that the resolution is deteriorated, depending on the material type of the inter-layer insulating film. The quantity of not more than 50 mmol/poly-100 g is set in consideration of the practical light exposure volume (1 $J/cm^2$ or less). As for the types of the basic compounds, reference may be had to paragraphs [0027] to [0043] of the JP Patent Kokai Publication No. JP-A-11-84639 and to paragraphs [0008] to [0009] and [0030] to [0033] of JP Patent Kokai Publication No. JP-P2001-194776A, the disclosures of these publications being herein incorporated by reference thereto.

In the present Example, one or both of propylene glycol monomethylether acetate (PGMEA) and ethyl lactate (EL) is used in a quantity of 600 weight parts of the solvent to 100 weight parts of the base resin. The organic solvents capable of dissolving the base resins and the acid generating agents, such as ketones, alcohols, ethers or esters may be used singly or as a mixture, only by way of an example. The organic solvent may be used in a quantity of 100 to 5000 weight parts and in particular 300 to 2000 weight parts to 100 weight parts of the base resin. As for the organic solvents, reference may be had to paragraphs [0044] to [0045] of the JP Patent Kokai Publication No. JP-A-11-84639 and to paragraph [0010] of JP Patent Kokai Publication No. JP-P2001-194776A, the disclosures of these publications being herein incorporated by reference thereto.

The substrate carrying a resist pattern for forming the via-holes is selectively sequentially dry-etched (plasma etched) in succession, beginning from the surface layer side, in the order of the anti-reflection film, cap film 3, inter-layer insulating film 4, etching barrier film 5 and the inter-layer insulating film 6, until the etching barrier film 7 is exposed (step A5). This yields the via-hole with a diameter of 0.2 $\mu$m (see FIG. 1a).

The resist pattern for forming the via-hole then subjected to $O_2$ plasma ashing and subsequently removed from the substrate carrying the via-holes using an organic removing (peeling) solution (step A6). The substrate cross-section is now in a state shown in FIG. 1a.

The amino component contained in the organic removing solution is affixed (adsorbed) to or oozed into (impregnated) the inter-layer insulating films 4 and 6. FIG. 2 shows the results of identification of the components affixed to the then existing (as-dried) inter-layer insulating films 4 and 6. FIG. 2 depicts the graph showing the results of identification in which the components affixed to the substrate carrying the Low-k film following the step A6 of the Example 1 are extracted in pure water and identified by a capillary elecrophorescent method (electrophoreogram) and in which the identified components of the organic removing solution are contrasted to the identified components affixed to the substrate. Although the components of the organic removing solution are not clear, comparison of the graph showing the components of the organic removing solution to the graph indicating the components affixed to the substrate reveals that the peak appears at approximately the same positions in each of the two graphs. It may safely be said that the organic removing solution remains affixed to the substrate even after resist removing and drying.

It is difficult to remove the amino components, once affixed to the inter-layer insulating films 4 and 6, by e.g., rinsing. There are occasions where preset heat treatment is carried out for reducing the quantity of the amino components affixed to the inter-layer insulating films 4 and 6. However, technical difficulties are encountered in completely removing the amino components, because of the temperature constraint for other wiring layers. It should be noted that the organic removing solution is a solution mixture of commercial organic alkaline components. Although amino components, such as ethylene diamine, monoethanolamine, methylamine, triethanolamine, methylamine, triethanolamine and methyl monoethanolamine are said to be contained therein, the chemical composition is not clarified. As the publications suggesting the amino components contained in the organic removing solution, reference may be had to JP Patent Kokai Publication No. JP-A-6-331541, JP Patent Kokai Publication No. JP-P2001-226696A and to JP Patent Kokai Publication No. JP-P2000-89488A, the disclosures of these publication being herein incorporated by reference thereto.

The surface of the substrate, from which the resist pattern for forming the via-hole has been removed, is coated with anti-reflection film forming composition (spin coating) and pre-baked at 200° C. for 90 seconds to form an anti-reflection film 2 adjusted to a film thickness (film thickness on the surface of the cap film 3) of 50 nm (step A7). The anti-reflection film 2 is formed in the via-hole to a small thickness on the sidewall of the via-hole at the same time as it is accumulated in the bottom of the via-hole (see FIG. 1b).

The amino components affixed to the inter-layer insulating films 4 and 6 at the time of pre-baking the anti-reflection film 2 are ejected at this time in a small quantity to atmosphere. However, the majority of the amino components are presumably affixed to the inter-layer insulating films 4 and 6 or left over in the anti-reflection film. It should be noted that the anti-reflection film 2 is of the same material as that used for forming the via-hole.

The surface of the anti-reflection film 2 is then coated by spin coating with a photoresist (chemical amplification type positive photoresist film composition). The resulting product is pre-baked at 95° C. for 90 seconds, using a hot plate, to form a photoresist film 1, adjusted to a film thickness of 600 nm (film thickness as measured on the cap film 3) (step A8). The photoresist film is formed in this manner as the photoresist is buried in the via-hole (see FIG. 1c).

The amino components, affixed to the inter-layer insulating films 4 and 6 or present in the anti-reflection film 2, are now transmitted through the anti-reflection film 2 so as to be dissolved into the photoresist 1. The feed solution for the photoresist 1 is of the same material as that of the photoresist used in forming the via-hole (chemical amplification type positive photoresist film composition), and is made up by the base resin, acid generating agent, basic compounds (1 to 4.2 mmol/poly-100 g) and a solvent.

The substrate, carrying the photoresist film 1, is exposed to light, with an optimum volume of the light for exposure and an optimum focus, using a KrF excimer laser scanner (manufactured by Nikon under the trade name of NSR-S204B. Immediately after the light exposure, the resulting product is post-baked at 105° C. for 90 seconds and developed for 60 seconds in an aqueous solution of tetramethyl ammonium hydroxide containing 2.38 wt % of the developing solution (step A9). This forms a resist pattern for forming the wiring groove (resist pattern having an opening in an area including the sidewall surface at the step difference in the substrate) (see FIG. 11d).

At this time, no photoresist, which might otherwise cause resolution deficiency, is left over in the via-hole or in its vicinity, in a manner different from the case of using the conventional photoresist not containing more than 1 mmol/poly-100 g of the basic compound, such that the photoresist exposed to light may be removed with the developing solution. FIG. 3 (Example 1) shows the state of the substrate surface. Reference to the respective patterns of the Example 1 of FIG. 3 indicates that the area corresponding to the via-hole is represented in black as a groove shadow, there being no residual photoresist in the via-hole.

The acid catalyst ($H^+$) yielded from the acid generating agent by this light exposure is partially neutralized with the basic substance (quencher) in the photoresist, while also being neutralized with extraneous amino components intruded into the photoresist. This neutralization of the amino components leads to a diminished quantity of the acid catalyst ($H^+$) in the photoresist. However, part of the neutralized basic substance (protons and salts of the basic substance) is dissociated into protons ($H^+$) and the basic substance to prevent the acid catalyst ($H^+$) in the photoresist from being lowered in concentration. Since the acid catalyst ($H^+$) in the photoresist may be prevented from being lowered in concentration, the base resin may be transformed into a substance soluble in the developing solution (the protective groups in the base resin may be transformed into hydroxyl groups). That is, the photoresist may be improved in resistance against poisoning. The basic substance, protons and the salts of the basic substance are in equilibrium relative to one another.

The substrate carrying a resist pattern for forming the wiring groove is selectively sequentially etched in succession by dry etching, beginning from the surface layer side, in the order of the anti-reflection film 2, cap film 3 and the inter-layer insulating film 4, until the etching barrier film 7 is exposed (step A10). This yields a wiring groove 22 (see FIGS. 1e and f).

The resist pattern now carrying the wiring groove then is subjected to $O_2$-plasma ashing and subsequently removed using an organic removing solution (step A11).

The etching barrier film 7, exposed in the substrate, now freed of the resist pattern for forming the wiring groove, is etched by the etchback method, until the Cu underlying wiring 8 is exposed (step A12). This gives the substrate cross-section shown in FIG. 1g.

The substrate, the Cu underlying wiring 8 of which has partially been exposed, is finally rinsed, a Cu plating film 9 is formed on the substrate surface by CVD (by burial in the via-hole and in the wiring groove) and the resulting product then is planarized until the inter-layer insulating film 4 is exposed (step A13). This completes the dual Damascene wiring 9 electrically connected to the Cu underlying wiring 8 (see FIG. 1h).

In the present Example, the photoresist in the via-hole 21 is resolved on light exposure and is not left over even after processing with the developing solution (FIG. 1d). As may be seen from the patterns of the first Example of FIG. 3, the pattern portion corresponding to the via-hole is represented in black as the shadow of the groove, so that the resist pattern is formed satisfactorily. The difference of the present Example from the Comparative Example is apparent.

The relation between the closure of the via-hole directly after the formation of the resist pattern for forming the wiring groove of Example 1 and the photoresist composition is now explained.

The relation which might exist between the closure of the via-hole due to poisoning of the photoresist and the photoresist composition was scrutinized.

Figure 4:
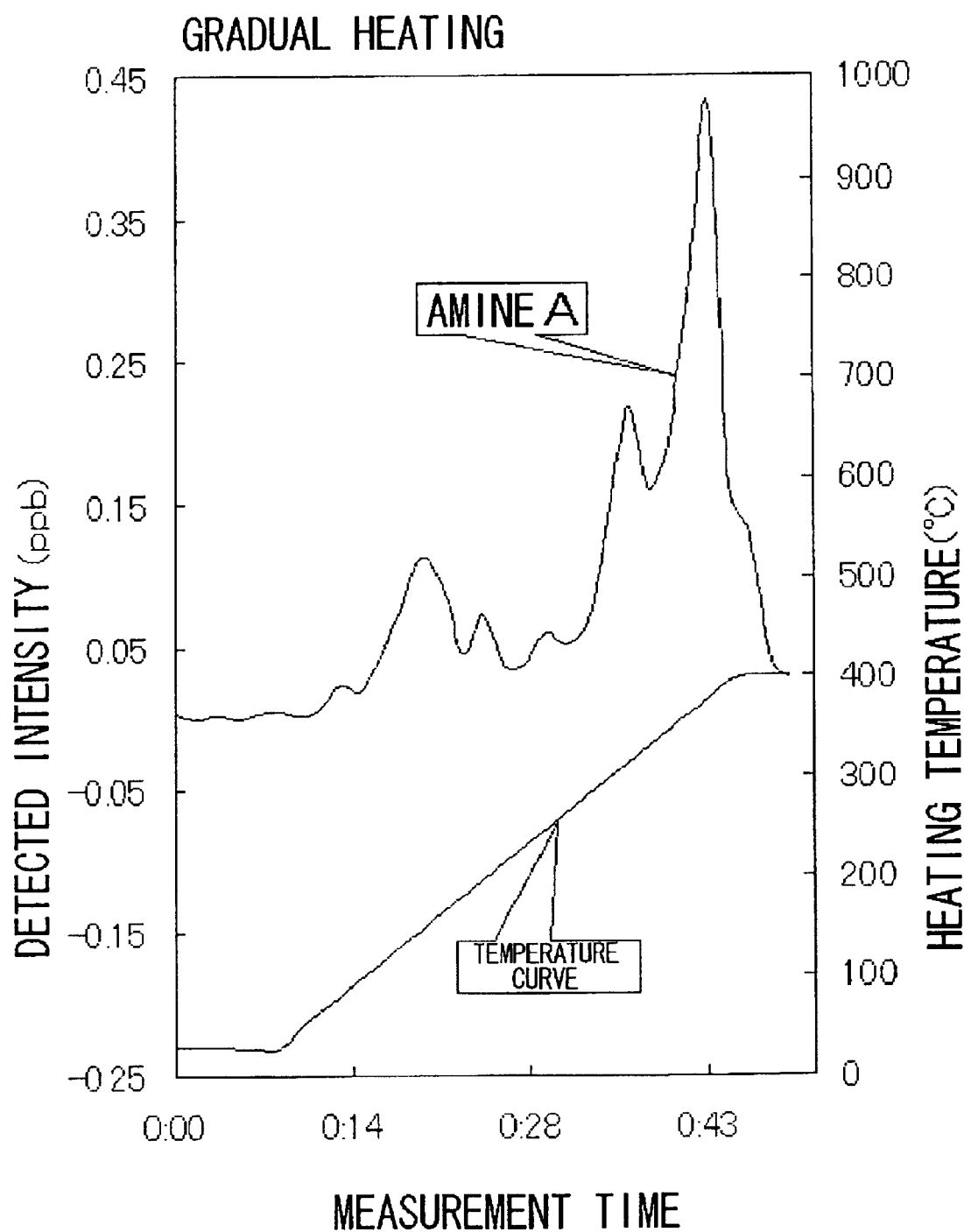
FIG. 4 is a comprehensive graph showing an intensity curve for detected poisoning components desorbed from the substrate having the Low-k film after step A6 of Example 1, against time, and the gradually rising temperature, in case the temperature is increased gradually.
Figure 5:
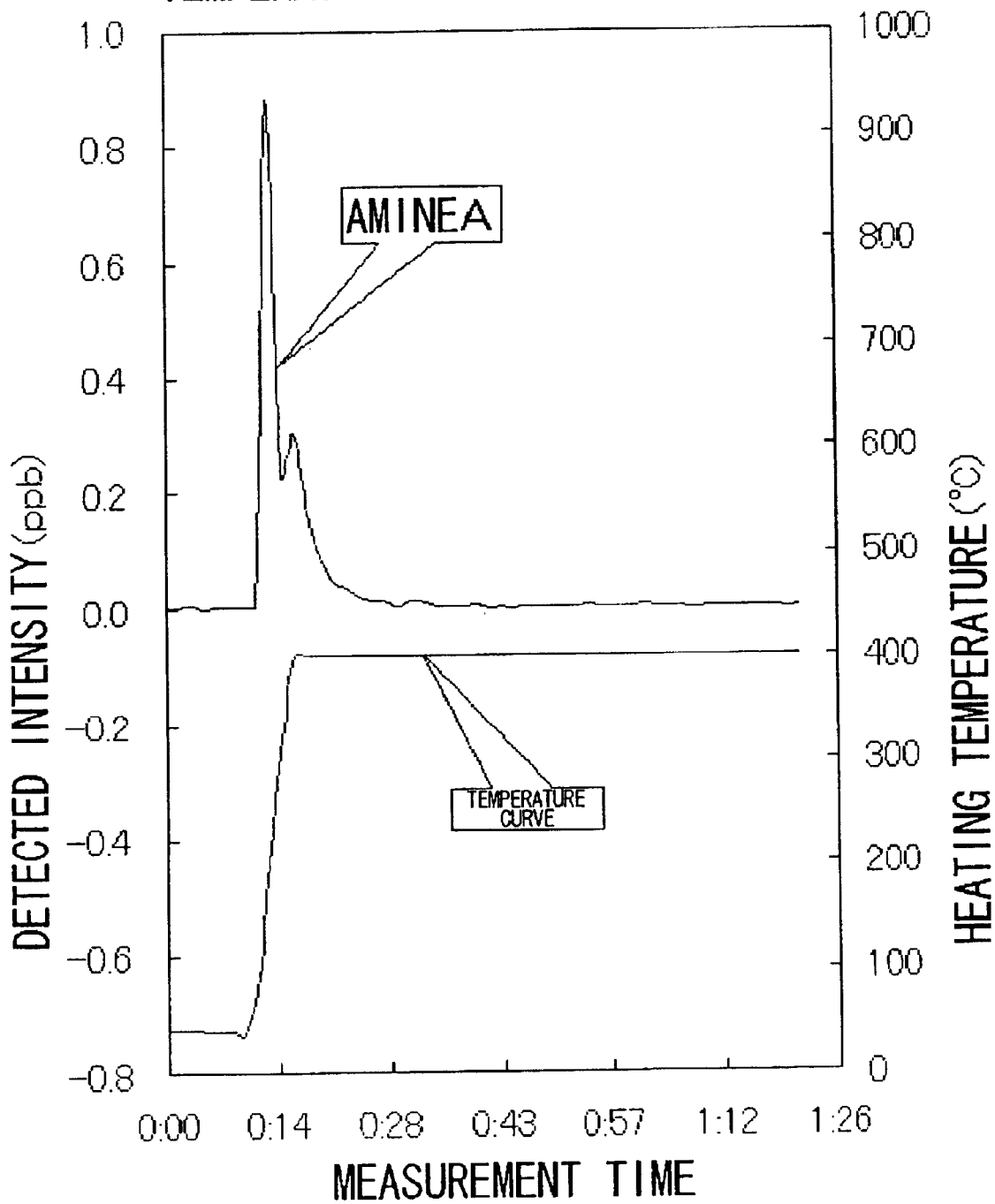
FIG. 5 is a comprehensive graph showing an intensity curve for detected poisoning components desorbed from the substrate having the Low-k film after step A6 of Example 1, against time, and the rising temperature, in case the temperature is increased rapidly up to 400° C. at which the temperature then is kept constant.

For manufacturing the substrate, the step A1 (step of forming an insulating film) to the step A9 (step of forming the resist pattern for forming the wiring groove) of Example 1 were carried out. Table 1 below shows the material types, film thicknesses, processing and the configuration contents of the substrates 1 to 3 used in the test (see FIG. 1d). HSQ means a Si—H containing $SiO_2$ film. The pre-processing denotes heat treatment at a heating temperature of 350° C. and for the heating time of 30 minutes, carried out between step S6 (removing of the resist used for forming the via-hole) and step A7 (formation of the anti-reflection film for forming the wiring groove). The heating temperature of 350° C. is used because the quantity of desorption (release) of the adsorbed poisoning components (amino components) from the inter-layer insulating film 4 empirically reaches a peak at 300° C. to 400° C. (see FIG. 4). The heating time for heat treatment of 30 minutes is used because heating for 30 minutes or longer at an elevated temperature of 300° C. to 400° C. is empirically required in order to remove the poisoning components (amino components) from the inter-layer insulating film 4 (see FIG. 5). The graph of FIG. 4 comprehensively depicts a curve for increasing temperature when the temperature is increased gradually, and a curve for detected intensity with lapse of time of the poisoning components (amino components A) desorbed from the substrate having the Low-k film (HSQ) following the step A6 of Example 1 (step of removing of the resist used for forming the via-hole). The graph of FIG. 5 comprehensively depicts a curve for increasing temperature when the temperature is increased rapidly, to 400° C. at which the temperature was fixed and a curve for detection intensity with lapse of time of the poisoning components (amino components A) desorbed from the substrate having the Low-k film following the step A6 of Example 1 (step of removing of the resist used for forming the via-hole).

TABLE 1

|  | SUBSTRATE 1 | SUBSTRATE 2 | SUBSTRATE 3 |
|---|---|---|---|
| PHOTORESIST FILM 1 | SEE TABLES 2, 3/600 nm | | |
| ANTI-REFLECTION FILM 2 | MANUFACTURED BY TOKYO OKA KOGYO SHA/50 nm | | |
| INTER-LAYER INSULATING FILM 3 | $SiO_2$/250 nm | | |
| INTER-LAYER INSULATING FILM 4 | $SiO_2$/300 nm | HSQ/300 nm | HSQ/300 nm |
| ETCHING BARRIER FILM 5 | SiC/50 nm | | |
| INTER-LAYER INSULATING FILM 6 | $SiO_2$/350~400 nm | | |
| ETCHING BARRIER FILM 7 | SiCN/70 nm | | |
| PRE-PROCESSING | NOT PERFORMED | NOT PERFORMED | PERFORMED |
| VIA-HOLE DIAMETER | 0.2 μm | | |

Tables 2 and 3 below depict the compositions of the chemical amplification type positive photoresist film composition (samples) used for the photoresist 1. The Polymer A in the base resin is the base resin indicated in the chemical formula 1. The PAG1 to 5 of the acid generating agent depict those shown by the chemical formula 3. The unit of the base (quencher) is [mmol/poly-100 g] (mmol of the basic compound per 100 g of the base resin). The [base 1], [base 2] and [base 3] in the base depict triethanolamine (molecular weight: 149.19), tri-n-butylamine (molecular weight: 185.36) and 2-butoxypyridine (molecular weight: 151.21), respectively. The [PGMEA] and [EL] of the organic solvent depict propyleneglycol monomethylether acetate and ethyl lactate, respectively.

TABLE 2

| Samples | Base resin (wt. parts) | Acid generating agent (1) (wt. parts) | Acid generating agent (2) (wt. parts) | Base (unit) | Organic solvent (wt. parts) |
|---|---|---|---|---|---|
| Sample 1 | Polymer A (100) | PAG1 (2) | PAG2 (0.6) | Base 1 (0.3) | PGMEA (600) |
| Sample 2 | Polymer A (100) | PAG1 (2) | PAG2 (0.6) | Base 1 (0.6) | PGMEA (600) |
| Sample 3 | Polymer A (100) | PAG1 (2) | PAG2 (0.6) | Base 1 (1) | PGMEA (600) |
| Sample 4 | Polymer A (100) | PAG1 (2) | PAG2 (0.6) | Base 1 (1.5) | PGMEA (600) |
| Sample 5 | Polymer A (100) | PAG1 (2) | PAG2 (0.6) | Base 1 (1.9) | PGMEA (600) |
| Sample 6 | Polymer A (100) | PAG1 (2) | PAG2 (0.6) | Base 1 (3.1) | PGMEA (600) |
| Sample 7 | Polymer A (100) | PAG1 (2) | PAG2 (0.6) | Base 1 (4.2) | PGMEA (600) |
| Sample 8 | Polymer A (100) | PAG1 (2) | PAG2 (0.6) | Base 1 (3.1) | PGMEA (600) |

TABLE 3

| Samples | Base resin (wt. parts) | Acid generating agent (1) (wt. parts) | Acid generating agent (2) (wt. parts) | Base (unit) | Organic solvent (wt. parts) |
|---|---|---|---|---|---|
| Sample 9 | Polymer A (100) | PAG3 (2) | PAG4 (1) | Base 2 (0.5) | PGMEA/EL (600) |
| Sample 10 | Polymer A (100) | PAG3 (2) | PAG4 (1) | Base 2 (1.5) | PGMEA/EL (600) |
| Sample 11 | Polymer A (100) | PAG3 (2) | PAG4 (1) | Base 2 (2) | PGMEA/EL (600) |
| Sample 12 | Polymer A (100) | PAG5 (1) | | Base 3 (0.5) | PGMEA/EL (600) |
| Sample 13 | Polymer A (100) | PAG5 (1) | | Base 3 (1) | PGMEA/EL (600) |
| Sample 14 | Polymer A (100) | PAG5 (1) | | Base 3 (2) | PGMEA/EL (600) |

Table 4 below shows the results as to the occurrence or non-occurrence of via closure defects due to poisoning in case of application of various samples (samples 1 to 14; see Tables 2 and 3) to respective substrates (substrates 1 to 3; see Table 1). In Table 4, the closure defect [occurred] is for the Comparative Example and the closure defect [not occurred] is for the Example.

| Samples | Via closure defect due to resist poisoning | | |
| --- | --- | --- | --- |
| (photoresist) | Substrate 1 | Substrate 2 | Substrate 3 |
| Sample 1 | occurred | occurred | occurred |
| Sample 2 | occurred | occurred | occurred |
| Sample 3 | not occurred | occurred | not occurred |
| Sample 4 | not occurred | occurred | not occurred |
| Sample 5 | not occurred | occurred | not occurred |
| Sample 6 | not occurred | not occurred | not occurred |
| Sample 7 | not occurred | not occurred | not occurred |
| Sample 8 | not occurred | not occurred | not occurred |
| Sample 9 | occurred | occurred | occurred |
| Sample 10 | not occurred | occurred | not occurred |
| Sample 11 | not occurred | not occurred | not occurred |
| Sample 12 | occurred | occurred | occurred |
| Sample 13 | not occurred | occurred | not occurred |
| Sample 14 | not occurred | not occurred | not occurred |

Figure 6:
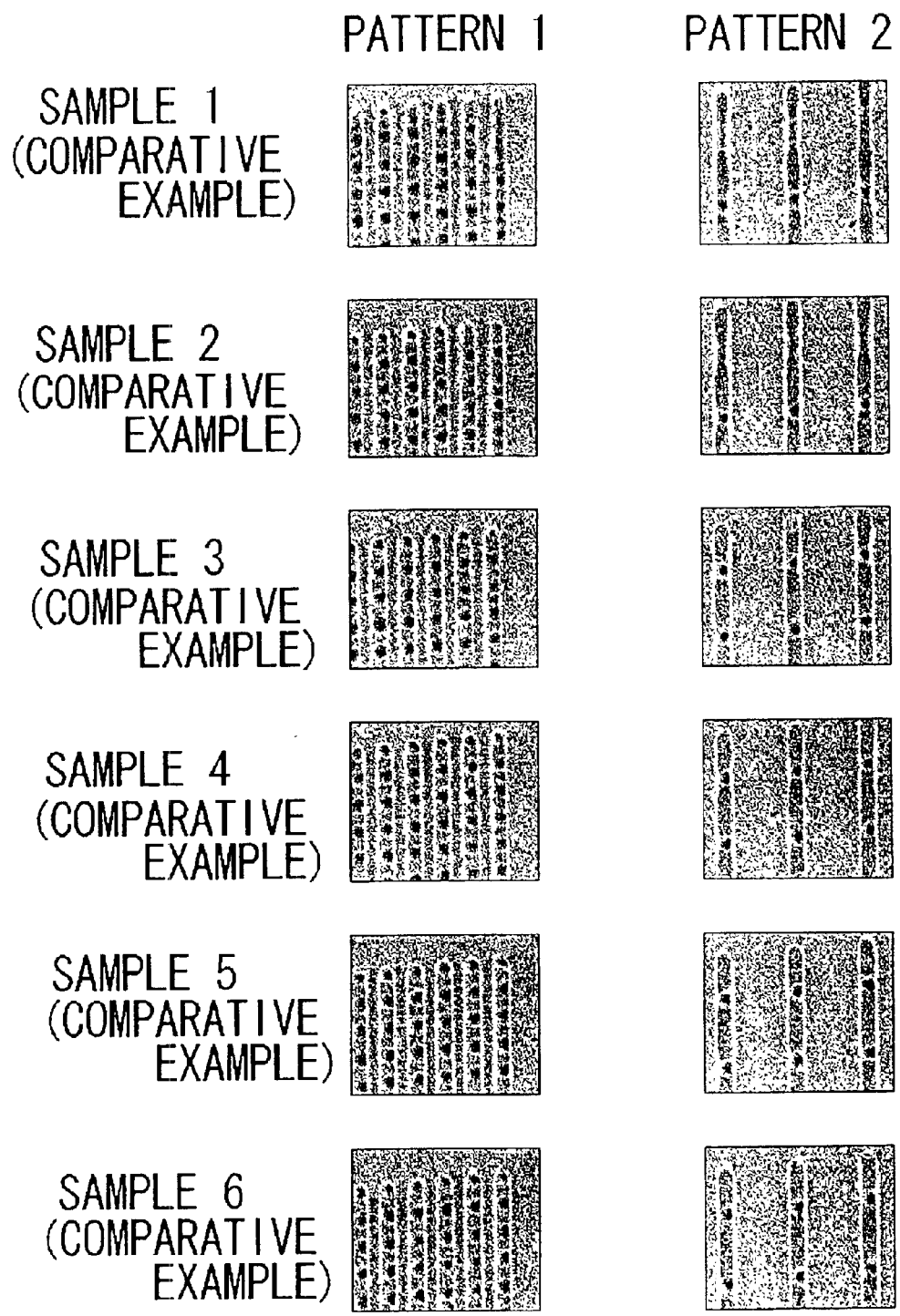
FIG. 6 is an enlarged photo showing the states of the substrates following the process of forming the resist pattern for forming the wiring groove in the method for manufacturing the semiconductor device of Example 1 and the Comparative Example 1 (substrate 1, samples 1 to 6).

The appearance of the substrate surface in case of application of the samples 1 to 6 (chemical amplification type positive photoresist film composition) to the substrate 1 (silicon oxide film) and the substrate 2 (Low-k film) is shown in FIG. 6 for the substrate 1 (SiO2) and in FIG. 7 for the substrate 2 (HSQ).

Specifically, the substrate 1, employing a silicon oxide film as the inter-layer insulating film 4 of FIG. 1d, suffers from via closure deficiency in samples with the quencher concentration smaller than 1 mmol/poly-100 g, namely in sample 1 (0.3), sample 2 (0.6), sample 9 (0.5), sample 12 (0.5). Conversely, the samples 3 to 8, 10, 11, 13 and 14, where the quencher concentration is not less than 1 mmol/poly-100 g, suffer from no via closure deficiency. It is thus seen that when the inter-layer insulating film 4 is a silicon oxide film, the resistance against poisoning of the resist is demonstrated for the quencher concentration not less than 1 mmol/poly-100 g.

The substrate 2, not pre-processed, employing the Low-k (HSQ) as the inter-layer insulating film 4 of FIG. 1d, suffers from via closure deficiency in samples 1 to 5, 9, 10, 12 and 13 where the quencher concentration is smaller than 2 mmol/poly-100 g, while not suffering from via closure deficiency in samples 6 to 8, 11 and 14 where the quencher concentration is not less than 2 mmol/poly-100 g. Thus, if the inter-layer insulating film 4 of FIG. 1d is the Low-k film (HSQ), not pre-processed, the resistance against poisoning of the resist may be exhibited at the quencher concentration not less than 2 mmol/poly-100 g.

The pre-processed substrate 3, employing the Low-k (HSQ) as the inter-layer insulating film 4 of FIG. 1d, suffers from via closure deficiency in samples 1, 2, 9 and 12 where the quencher concentration is smaller than 1 mmol/poly-100 g, while not suffering from via closure deficiency in samples 3 to 8, 10, 11, 13 and 14 where the quencher concentration is not less than 1 mmol/poly-100 g. Thus, if the inter-layer insulating film 4 of FIG. 1d is the pre-processed Low-k film (HSQ), the resistance against poisoning of the resist may be exhibited at the quencher concentration not less than 1 mmol/poly-100 g.

It follows from the foregoing that the substrate having the via-hole, employing the Low-k film as the inter-layer insulating film (substrate 2), is more susceptible to the resist poisoning than the substrate having the via-hole, employing the silicon oxide film as the inter-layer insulating film (substrate 2). Thus, it may be estimated that, as the dielectric constant of the inter-layer insulating film progresses toward a low value, that is with the increasing quantity of the interstice, it becomes necessary to increase the quencher concentration. For reference, measurement was made of the desorbed quantity of the component A of the organic removing solution (amine A) and that of the component B of the organic removing solution (amine B) in case when the substrate following the step A6 of Example 1 (process of removing the resist for forming the via-hole) was heated to a predetermined temperature. Under the condition that the temperature was gradually raised to 350° C., the desorbed quantity of the amine A from the substrate carrying the silicon oxide film (equivalent to the substrate 1) was 6.1 ng/cm2, while that of the amine B from the same substrate was 63 ng/cm2. Under the condition that the temperature was gradually raised to 400° C., the desorbed quantity of the amine A from the substrate carrying the Low-k film (equivalent to the substrate 2) was 44 ng/cm$^2$, while that of the amine B from the same substrate was 220 ng/cm$^2$.

It may be assumed that, if the film thickness of the inter-layer insulating film or the diameter of the via-hole is increased, the surface area of the via-hole is increased, such that a large quantity of impurities, such as the organic removing solution, is deposited thereto, and hence the quencher concentration is increased. If conversely the via-hole diameter is decreased, it may be assumed that the surface area of the via-hole is decreased, such that the quantity of impurities, such as the organic removing solution, deposited thereto, may be decreased, and hence the quencher concentration may be decreased. However, if the via-hole diameter is excessively decreased, the organic removing solution tends to be left in the via-hole under the surface tension, such that the quencher concentration cannot be decreased excessively.

In addition, if only a preset value of the quencher concentration is guaranteed for the chemical amplification type photoresist composition, resistance against poisoning may be demonstrated, even lacking the pre-processing, aimed to remove the impurity components, so that it is possible to diminish or eliminate the pre-processing step following the resist removal.

If it is presumed that the acid catalyst falls into shortage in the chemical amplification type photoresist composition due to neutralization with the quencher, the quantity of addition of the acid generating agent in the chemical amplification type photoresist composition may be suitably increased depending on the quencher concentration (see for example samples 6 and 8 of Table 2).

Referring to the drawings, a second Example of the present invention is explained. FIG. 8 depicts a schematic partial cross-sectional view illustrating, step by step, the substrate being produced by the manufacturing method for the semiconductor device of the second Example of the present invention.

First, an etching barrier film 7, an inter-layer insulating film 6, an etching barrier film 5, an inter-layer insulating film 4 and a cap film 3, are sequentially formed, beginning from the substrate side, on the substrate surface, on which is already formed a Cu underlying wiring 8, exposed on the substrate surface, as in Example 1 described above (see FIG. 8a).

An anti-reflection film then is formed on the surface of the cap film 3, and a resist pattern for forming the via-hole is formed on the surface of the anti-reflection film, as in Example 1 described above.

The substrate, carrying a resist pattern for forming the via-hole is selectively etched, as in the Example 1, beginning from the surface layer side, in the order of the anti-reflection film, cap film 3, inter-layer insulating film 4, etching barrier film 5 and the, inter-layer insulating film 6. This completes the via-hole 21 (see FIG. 8*a*).

The resist pattern for forming the via-hole then is subjected to $O_2$ plasma ashing and subsequently removed from the substrate carrying the via-hole using an organic removing solution (step A6). The substrate cross-section is now in a state shown in FIG. 8*a*.

The amino component contained in the organic removing solution is affixed (adsorbed) to or oozed into the inter-layer insulating films 4 and 6.

A feed solution of the anti-reflection film 2 is coated by spin coating on the substrate surface, from which the resist pattern for completely filling the via-hole has been removed, for completely filling in the via-hole. The resulting product was pre-baked at 200° C. for 90 seconds to form an anti-reflection film adjusted to a film thickness of 150 nm as measured on the surface of the cap film 3 (see FIG. 8*b*).

At the time of the pre-baking, the amino components, affixed to the inter-layer insulating films 4 and 6, are released in a minor quantity to outside air. However, the major portion of the amino components is estimated to be affixed to the inter-layer insulating films 4 and 6, or present in the anti-reflection film 2. It is noted that the anti-reflection film 2 is of the same material as that used in the Example 1 described above.

The surface of the anti-reflection film 2 is then coated by spin coating with a photoresist (chemical amplification type positive photoresist film composition). The resulting product is pre-baked at 95° C. for 90 seconds, using a hot plate, to form a photoresist film 1, adjusted to the film thickness of 600 nm (film thickness as measured on the cap film 3). The photoresist film is formed in this manner as the photoresist is not buried in the via-hole (see FIG. 8*c*).

The amino components, affixed to the inter-layer insulating films 4 and 6 or present in the anti-reflection film 2, are now transmitted through the anti-reflection film 2 so as to be dissolved into the photoresist 1. The feed solution for the photoresist 1 is of the same material as that of the photoresist used in the first embodiment (1 to 4.2 mmol/poly-100 g) and a solvent.

The substrate, carrying the photoresist film 1 of the chemical amplification type, is exposed to light, with an optimum volume of the light for exposure and an optimum focus, using a KrF excimer laser scanner (manufactured by Nikon under the trade name of NSR-S204B). Immediately after the light exposure, the resulting product is post-baked at 105° C. for 90 seconds and developed for 60 seconds in an aqueous solution of tetramethyl ammonium hydroxide containing 2.38 wt % of the developing solution. This forms a resist pattern for forming the wiring groove (see FIG. 8*d*). Here again, the resistance of the photoresist against poisoning is improved, as in Example 1 described above.

Figure 8A:
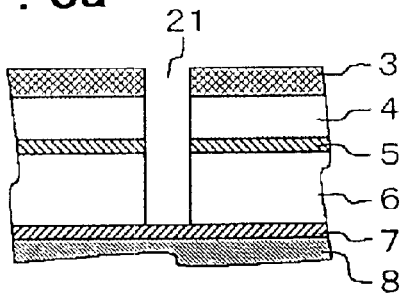
FIGS. 8a–8h are partial cross-sectional views showing the states of the substrate for respective steps of he method for manufacturing the semiconductor device of Example 1 step by step.
Figure 8B:
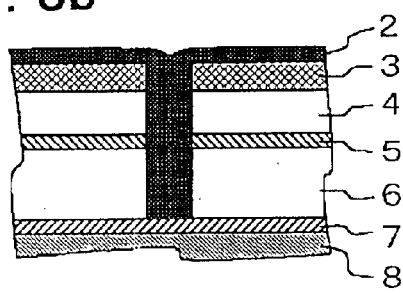
Figure 8C:
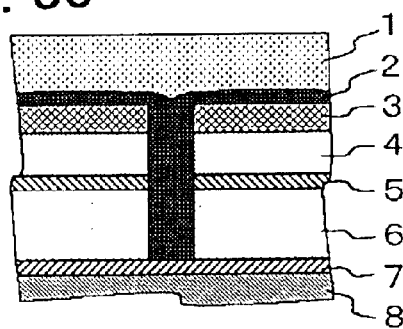
Figure 8D:
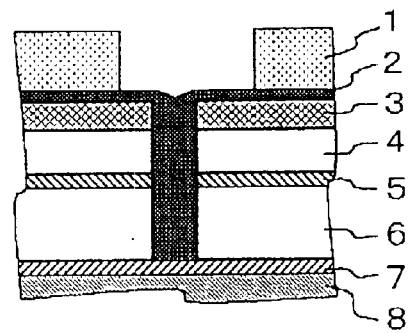
Figure 8E:
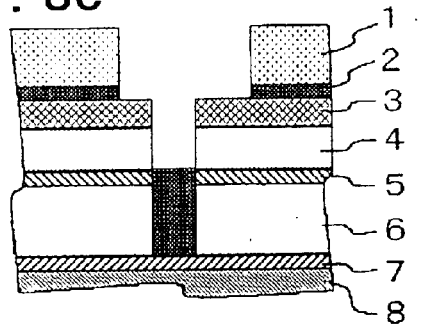
Figure 8F:
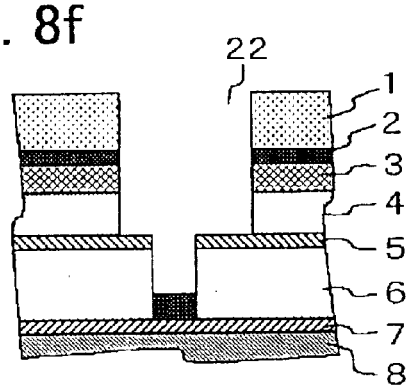
Figure 8G:
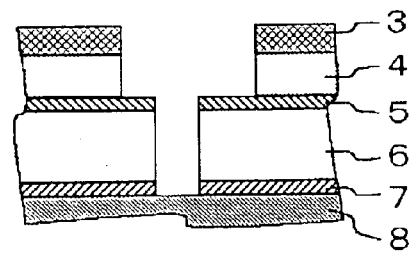
Figure 8H:
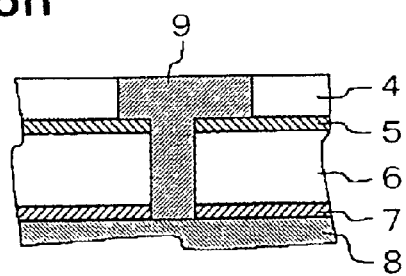
Figure 9A:
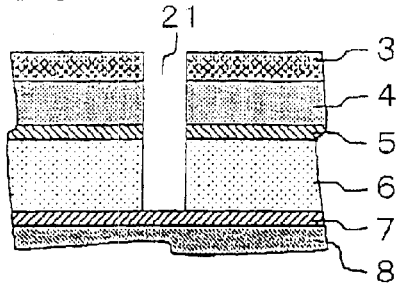
FIGS. 9a–9h are partial cross-sectional views showing the states of the substrate for respective steps of the method for manufacturing the semiconductor device of Comparative Example step by step.
Figure 9E:
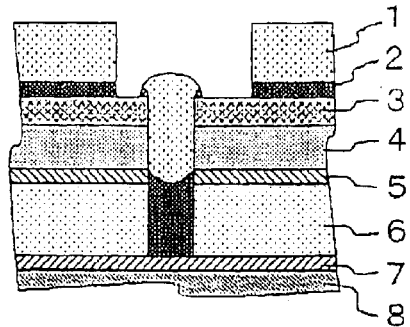
Figure 9B:
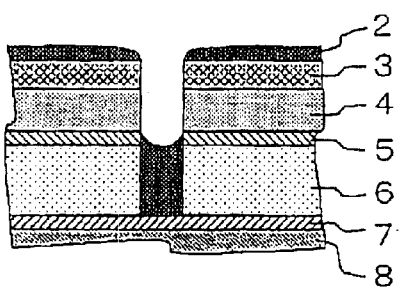
Figure 9F:
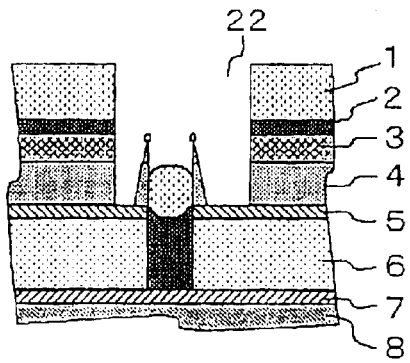
Figure 9C:
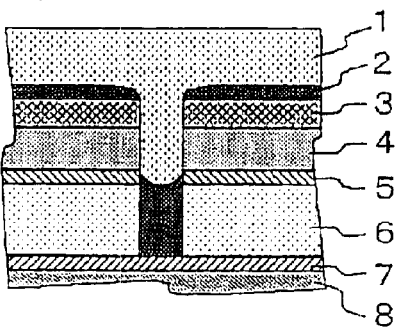
Figure 9G:
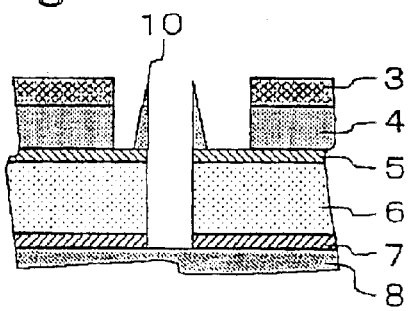
Figure 9D:
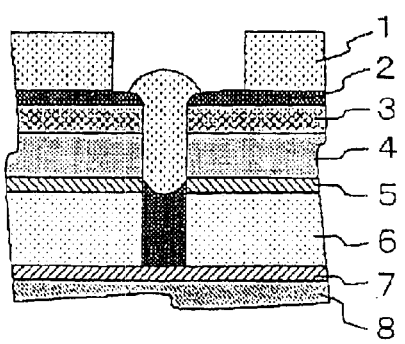
Figure 9H:
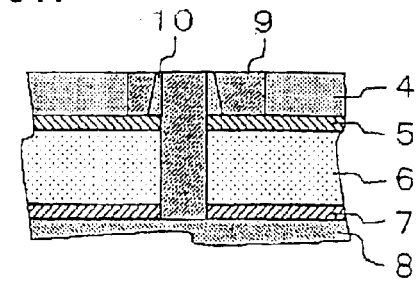

The substrate carrying a resist pattern for forming the wiring groove is etched in succession by dry etching, beginning from the surface layer side, in the order of the cap film 3 and the inter-layer insulating film 4, until the etching barrier film 5 is exposed (see FIG. 8*e*). This yields a wiring groove 22 (see FIG. 8*f*).

The resist pattern now carrying the wiring groove then is subjected to $O_2$ plasma ashing and subsequently removed using an organic removing solution.

The etching barrier film 7, exposed in the substrate, now freed of the resist pattern for forming the wiring groove, is etched by the etchback method, until the Cu underlying wiring 8 is exposed. This gives the substrate cross-section shown in FIG. 8*g*.

The substrate, the resist pattern of which was used for forming the wiring groove, has partially been exposed, is finally rinsed, a Cu plating layer 9 is formed on the substrate surface by CVD (by burial in the via-hole and in the wiring groove) and the resulting product then is planarized until the inter-layer insulating film 4 is exposed. This completes the dual Damascene wiring 9 electrically connected to the Cu underlying wiring 8 (see FIG. 8*h*).

In the present Example, the photoresist in the via-hole 21 is resolved on light exposure, and is not left, as in Example 1, even after processing with the developing solution.

Other Examples are now explained.

As Example 3, the substrate of Examples 1 and 2 may be applied to a substrate employing a porous film as the interlayer insulating film. The reason is that the resistance against poisoning may be demonstrated even in case of a porous film into which the poisoning component in the photoresist seeps in larger quantities.

As a fourth Example, the development time for the chemical amplification type photoresist need not be 60 seconds but may also be 30 seconds or more. The reason is that the resistance against poisoning is improved, as a result of addition of a quantity in excess of a certain quantity of the quencher in the chemical amplification type photoresist, as a result of which satisfactory resist patterns can be formed despite the shortened development time. The development time duration is preferably extended to longer than 60 seconds. The reason is that the volume of light exposure for patterning may be decreased by elongating the development time, while the sensitivity of the chemical amplification type photoresist, lowered by quencher addition, can be compensated. Meanwhile, the sensitivity has been improved by 3 to 20% (approximately 10%) by setting the development time to 60 seconds from 30 seconds.

As an Example 5, the chemical amplification type positive photoresist film composition, used in Examples 1 and 2, may be used. The reason is that, unless a certain quantity of the basic compound is contained in the chemical amplification type negative photoresist composition, containing a base resin, a crosslinking agent, an acid generating agent and a solvent, the acid catalyst, generated on photodecomposition of the acid generating agent, is poisoned by the poisoning component (amino component) which has seeped into the inter-layer insulating film to disable the cross-linking.

The meritorious effects of the present invention are summarized as follows.

According to the present invention, an optimum resist pattern may be formed on the substrate surface, having a step difference portion to which the organic removing solution (poisoning material) is deposited or oozed, by employing a photoresist added by not less than 0.1 mmol/poly-100 g of the quencher. It is because the photoresist exhibits resistance against the organic removing solution affixed to the substrate (inter-layer insulating film).

In addition, the pre-processing step for removing the poisoning substance, carried out intermediate the via-hole forming process and the wiring groove forming process, such as heat treatment, UV processing or oxygen plasma processing, may be rendered less laborious, such as by reducing the processing time. Moreover, an optimum resist pattern may be formed without removing poisoning substances (organic removing solution).

Moreover, there is no need for completely burying the anti-reflection film, to be formed in the wiring groove forming process, in the via-hole formed in the previous process, such that it is possible to reduce the time for coating the anti-reflection film and the coating quantity of the anti-reflection film.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A method for producing a semiconductor device, comprising the steps of:

forming a via hole in a substrate by applying a first resist film, etching the substrate using the first resist film as a mask, and removing the first resist film, wherein the substrate includes an insulating layer with a specific dielectric constant less than 4, wherein a sidewall of the via hole exposes a part of the insulating layer, and wherein the removing step pollutes the exposed part of the insulating layer;

forming a second resist film on the substrate, the second resist film being a chemical amplification type photoresist composition comprised of a base resin and a basic compound added to said base resin in a range of not less than 1 mmol to not more than 100 mmol to 100 g of the base resin, an amount of the basic compound being effective to prevent neutralization of a chemical amplifier in the second resist film by pollutants that escape from the exposed part of the insulating layer into the second resist film; and exposing a predetermined area of the second resist film to light to form a resist pattern that defines a trench over the via hole.

2. The method for producing a semiconductor device as defined in claim 1, wherein the basic compound added to said base resin in a range o not less than 2 mmol to not more than 50 mmol to 100 g of the base resin.

3. The method for producing a semiconductor device as defined in claim 1, wherein said chemical amplification type photoresist composition further comprises an acid generating agent added to said base resin in a range of not less than 2 mmol to not more than 50 mmol to 100 g of the base resin.

4. The method for producing a semiconductor device as defined in claim 1, wherein said chemical amplification type photoresist composition further comprises an acid generating agent added to said base resin in a range of not less than 0.5 weight parts and not larger than 10 weight parts of the base resin.

5. The method for producing a semiconductor device as defined in claim 1, wherein a predetermined area of said second resist film is exposed to light and subsequently developed for not less than 30 seconds using a developing solution.

6. A method for producing a semiconductor device comprising the steps of:

forming a via hole in a substrate subjected by etching using a first resist film, removing said first resist film from said substrate using at least an organic removing solution; and forming a second resist film on a portion of said substrate from which said first resist film has been removed, the second resist film comprising a chemical amplification type photoresist composition comprised of a base resin and a basic compound added to said base resin in a range of not less than 1 mmol to not more than 100 mmol to 100 g of the base resin, and exposing a predetermined area of said second resist film to light to form a second resist pattern that defines a trench over the via hole.

7. A method for producing a semiconductor device comprising the steps of:

forming a via hole in a substrate using a first resist pattern, and removing said first resist pattern using an organic removing solution; and forming a resist film on a part of the substrate having the via-hole formed therein using a chemical amplification type photoresist composition comprised of a base resin and a basic compound added to said base resin in a range of not less than 1 mmol to not more than 100 mmol to 100 g of the base resin; and exposing a predetermined area of said resist film to light to form a second resist pattern used for forming a wiring groove wherein the size of the groove is larger than the size of the via-hole.

8. The method for producing a semiconductor device as defined in claim 7, wherein said substrate includes one or more porous films exposed on a surface or on a sidewall surface of a step difference portion thereof.

9. The method for producing a semiconductor device as defined in claim 7, wherein said substrate includes one or more inter-layer insulating films exposed on a surface or on a sidewall surface of a step difference portion thereof.

10. The method for producing a semiconductor device as defined in claim 7, wherein said substrate includes one or more low dielectric constant films with a specific dielectric constant less than 4 exposed on a surface or on a sidewall surface of a step difference portion thereof.

11. The method for producing a semiconductor device as defined in claim 7, wherein said basic compound is added to said base resin in a range a not less than 2 mmol to not more than 50 mmol to 100 g of the base resin.

12. The method for producing a semiconductor device as defined in claim 7, wherein said chemical amplification type photoresist composition further comprises an acid generating agent added to said base resin in a range of not less than 2 mmol to not more than 50 mmol to 100 g of the base resin.

13. The method for producing a semiconductor device as defined in claim 7, wherein said chemical amplification type photoresist composition further comprises an acid generating agent added to said base resin in a range of not less than 0.5 weight parts and not larger than 10 weight parts of the base resin.

14. The method for producing a semiconductor device as defined in claim 7, wherein said resist pattern or said second resist pattern includes an opening in an area of aid substrate including a sidewall surface in a step difference portion thereof.

15. The method for producing a semiconductor device as defined in claim 7, wherein a predetermined area of said resist film is exposed to light and subsequently developed for not less than 30 seconds using a developing solution.

16. A method for removing a resist film during manufacture of semiconductor device, comprising the steps of;

forming a via hole in a substrate by applying a first resist film, etching the substrate using the first resist film as a mask, and removing the first resist film with an organic resist removal solution, wherein the substrate includes an insulating layer with a specific dielectric constant less than 4, wherein a sidewall of the via hole exposes a part of the insulating layer, and wherein the organic removing solution pollutes the exposed part of the insulating layer;

forming a second resist film on the substrate, the second resist film being a chemical amplification photoresist composition comprising a base resin and a basic compound that is effective to prevent neutralization of a chemical amplifier in the second resist, film by pollutants that escape from the exposed part of the insulating layer into the second resist film, an amount of the basic compound being in a range of not less than 1 mmol to not more than 100 mmol g of the base resin;

exposing a predetermined area of the second resist film to light to form a resist pattern that defines a trench over the via hole; and removing the second resist film after formation of the trench.

* * * * *